United States Patent
Stanley (10) Patent No.: US 6,694,454 B1
(45) Date of Patent: Feb. 17, 2004

(54) STUCK AND TRANSIENT FAULT DIAGNOSTIC SYSTEM

(75) Inventor: Kevin W. Stanley, St. Albans, VT (US)

(73) Assignee: International Business Machines Corporation, Armonk, NY (US)

( * ) Notice: Subject to any disclaimer, the term of this patent is extended or adjusted under 35 U.S.C. 154(b) by 592 days.

(21) Appl. No.: 09/608,559

(22) Filed: Jun. 30, 2000

(51) Int. Cl.[7] .............................................. G01R 31/28
(52) U.S. Cl. ...................................... 714/30; 714/726
(58) Field of Search ............................ 714/30, 31, 32, 714/33, 47, 48, 25, 26, 726, 727, 736, 732

(56) References Cited

U.S. PATENT DOCUMENTS

| | | | |
|---|---|---|---|
| 4,580,066 A | 4/1986 | Berndt | 307/276 |
| 4,989,209 A | 1/1991 | Littlebury et al. | 371/22.1 |
| 5,018,144 A | 5/1991 | Corr et al. | 371/22.3 |
| 5,115,191 A | 5/1992 | Yoshimori | 324/158 R |
| 5,181,133 A | 1/1993 | Farwell | 368/113 |
| 5,291,495 A * | 3/1994 | Udell, Jr. | 714/726 |
| 5,365,528 A | 11/1994 | Agrawal et al. | 371/25.1 |
| 5,452,309 A | 9/1995 | Ino et al. | 371/22.3 |
| 5,574,853 A * | 11/1996 | Barch et al. | 714/30 |
| 5,617,426 A | 4/1997 | Koenemann et al. | 371/22.3 |
| 5,642,362 A | 6/1997 | Savir | |
| 5,663,967 A * | 9/1997 | Lindberg et al. | 714/737 |
| 5,726,996 A * | 3/1998 | Chakradhar et al. | 714/724 |
| 5,737,340 A * | 4/1998 | Tamarapalli et al. | 714/733 |
| 5,923,836 A * | 7/1999 | Barch et al. | 714/33 |
| 6,067,650 A * | 5/2000 | Beausang et al. | 714/726 |
| 6,070,261 A * | 5/2000 | Tamarapalli et al. | 714/733 |
| 6,327,684 B1 * | 12/2001 | Nadeau-Dostie et al. | 714/731 |
| 6,453,437 B1 * | 9/2002 | Kapur et al. | 714/741 |

OTHER PUBLICATIONS

"High Accuracy Flush and Scan Software Diagnostic" Stanley et al. pp. 1–6, Feb. 23, 2000.
IBM TDB, Sep. 1989, pp. 231–232, vol. 32, No. 4A, "Shift Register Latch for Delay Testing".
IEEE, 1995, pp. 1912–1915, "Scan Chain Fault Diagnosis with Fault Dictionaries", Edirisooriya et al.
IEEE, 1999, pp. 153–157, "Scan Chain Diagnosis using IDDQ Current Measurement", Hirase et al.
IEEE, 1995, pp. 606–615, International Test Conference, Paper 26.3"Functional Tests for Scan Chain Latches", Maker et al.
IEEE, 1993, pp. 303–308, "On Diagnosis ofFaults in a Scan–Chain", Kundu.
IEEE, 1997, pp. 704–713, International Test Conference, Paper 29.3, "An Efficient Scheme to Diagnose Scan Chains" Narayanan et al.
IEEE, 1998, pp. 217–222, "Diagnosis of Scan Chain Failures", Wu.

* cited by examiner

Primary Examiner—Nadeem Iqbal
(74) Attorney, Agent, or Firm—Richard M. Kotulak (57) ABSTRACT

This invention teaches a computerized method for diagnosing both transient and stuck faults in scan chains. The method first examines repeating patterns in the scan test to determine the type of fault and creates a signature load for each stuck and transient fault based on the pattern for each type of fault. The method then runs a simulation using the signature at a selected assumed fault position. The results of the simulation are then compared with the actual scan result to see if the fault position was determined. If not, the method continues to run simulation on selected assumed fault positions until the simulated result matches the actual scan test results.

26 Claims, 7 Drawing Sheets

STUCK AND TRANSIENT FAULT DIAGNOSTIC SYSTEM

BACKGROUND OF THE INVENTION

Given the increasing complexity and density of current integrated circuit logic chips, the need to test the operation of logic in a reliable and efficient manner has become acute. One such test methodology is the so-called "level-sensitive scan design," or LSSD. Briefly in LSSD testing a chain of shift register latches (SRLs) or flip-flops are coupled to the inputs and outputs of the internal logic under test. The test is scanned serially into an input chain of shift register latches. When the input shift register is full, the data propgates through the logic under test and is written into a second chain of SRLs or flip-flops. The acquired data is then scanned serially out and compared to the expected data. The LSSD test indicates that the logic is not functioning properly when the acquired data does not match the expected data. Given a list of failing tests and the latches found to contain incorrect values, a diagnostic fault simulator can generally produce a list of potential defects which could have caused the fails observed at the tester. However, in order to obtain tractable run times, diagnostic simulators typically assume that all scan chains on the chip are performing correctly, and bypass the explicit simulation of the scanning operations. For this reason, standard diagnostic simulation techniques are ineffective for diagnosing faults in scan chain circuitry.

Failures that cause logic to malfunction at desired clock rates are referred to as delay faults or AC faults. These delay faults are typically due to random variations in process parameters that may cause device and/or wiring propagation delays to exceed specified limits. Tests for delay employ LSSD and are typically structured to provoke a 0-to-1 transition at the site of the fault to test for a slow-to-rise fault and normally structured to provoke a 1-to-0 transition to test for a slow-to-fall fault. Reference is made to commonly-assigned U.S. Pat. No. 5,642,362, entitled "Scan-Based Delay Tests Having Enhanced Test Vector Pattern Generation," issued on Jun. 24, 1997 to Savir for further information. As such, delay tests for logic circuits differ from static, stuck fault tests in that they characterize the dynamic properties of the circuit such as propagation delay.

One problem with using LSSD is that a greater and greater portion of the logic circuit area is taken up by the scan chains. Thus the chances of a failure appearing in the scan chain are becoming higher and higher. However, since normal diagnostic simulation techniques are not accurate for chips with defective scan chains, an increasing number of chips which require physical failure analysis can not be diagnosed using traditional methods. Since normal diagnostic simulation techniques are not accurate for chips with defective scan chains, however, an increasing number of chips which require physical failure analysis can not be diagnosed using traditional methods. There are several approaches proposed to solve stuck fault problems in defective scan chains. Examples of some approaches are "Scan Chain Diagnosis using IDDQ Current Measurement," by Hirase, et al., Proc. IEEE International Test Conference, page 153–157, February 1999, "Scan Chain Fault Diagnosis with Fault Dictionaries," by Geetani Edrisooriya, IEEE VLSI Test Symposium, February 1995, and "On Diagnosis of Faults in a Scan-Chain, by Sandip Kundu, IEEE VLSI Test Symposium, March 1993.

The problem with these approaches is they do not diagnose dynamic or transient faults or are manual in their search techniques. One proposed method to reach such faults is "An Efficient Scheme to Diagnose Scan Chains," by Sridhar Narayanan and Ashutosh Das, Proc. International Test Conference, pages 704–713, July 1997. The main idea of that approach is to add circuitry to a scan flop to enable its scan-out port to be either set or reset.

SUMMARY OF INVENTION

What is needed is a software technique that quickly and accurately diagnoses the failing latches in a defective scan chain, including those due to dynamic or transition defects. What the inventors have done is invent such a technique that is useful over a wide range of defect types and fault models and requires no special hardware or pattern generation.

To achieve the benefits of localizing scan chain defects, the inventors have created a diagnostic method called the High-Accuracy Flush-and-Scan Software Diagnostic. The method determines the defective latch by repeatedly simulating different loads (or initializations) until the simulation results match those from the tester.

More specifically the method for diagnosing faults in scan chains involves examining repeating patterns in the scan test to determine the type of fault, creating a symptom signature load for each fault based on the repeating patterns for each type of fault, running a simulation using the symptom signature at the assumed fault position, and comparing the simulated result with the actual scan test result to see if the fault position was determined.

In order to assist in the search of the fault position a search approach is used to determine the quality of the match at the assumed fault position.

DETAILED DESCRIPTION OF THE INVENTION

Figure 1:
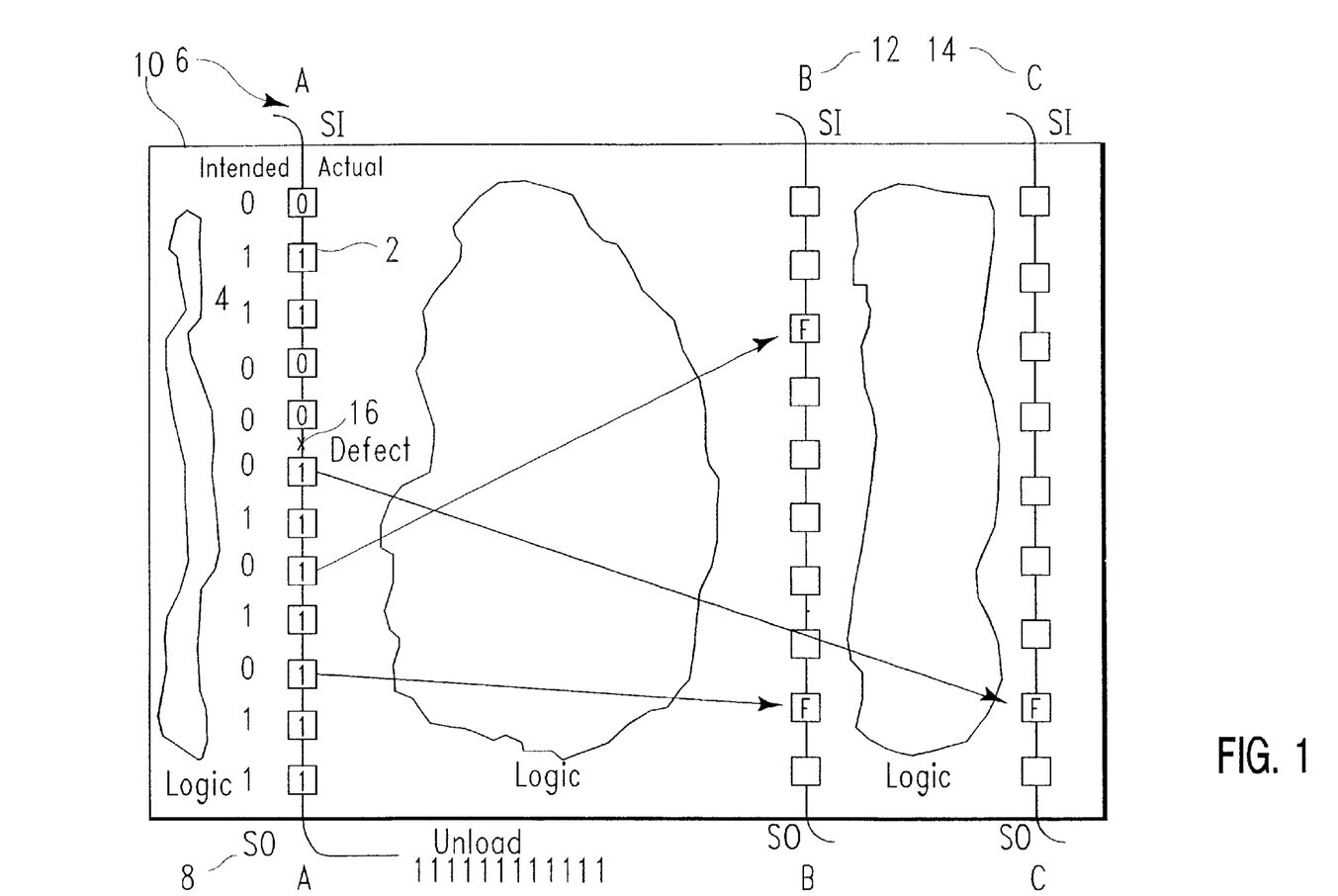
FIG. 1 is a simple block diagram of a chip depicting how a scan chain works.

Before explaining the details, it is useful to define terminology and give general background. FIG. 1 is a simple diagram of a chip, showing the basic concepts involved.

Scan design connects memory elements such as registers and counters 2 together into chains 4 so that the contents can be marched from one latch to the next. Connecting one end of the chain to a primary input, or scan-in (SI) pin 6, and the other to a primary output, or scan-out (SO) pin 8, allows data to be preset into the latches and observed out of the latches. Data can be "scanned in" by marching data values serially into the SI pin and data can be read or "scanned out" by marching data values out of the SO pin.

In this invention, strings of 1s and 0s will be used to illustrate values in chains. The left-most digit will be closest to scan-in the right-most digit closest to scan-out. For example, in 11111100000, the 1s are closest to scan-in and the 0s are closest to scan-out.

In the nomenclature of this invention, scan-chain integrity is tested in what are known as "flush" and "scan" tests. One usually thinks in terms of full LSSD implementations, but this need not be the case. The flush test places a value on the scan-in node and then holds the scan clocks "on", making the chain behave as though it were a continuous wire. If the value "flushes" through correctly, there is at least continuity and some assurance that the chain is good. Next, what we call the "scan test" checks for other defects. For example, can the latches properly transition from 1 to 0 and back? For this test the chain is loaded by shifting pairs of 1s and 0s (or another defined sequence) through the chain; no system (functional) clock is applied. The chain is then immediately unloaded. In working chains, the output will match the input.

In manufacturing test, testing normally stops if either the flush or scan test fails. If they both pass, the tester proceeds with what we call "logic test" (i.e., functional or LSSD test). This is where specific initial values (patterns) are loaded into the scan chains and are propagated through the logic by using the system clock; the results are captured in other latches. If there is a defect in the logic, a wrong result will be captured. If there is a defect in the chain, many wrong initial values will be loaded and many wrong results will be captured.

FIG. 1 illustrates the principle at a high level. It shows a "string" of 1's and 0's (10) being loaded into Chain A. Conceptually, this will preset the latches in that chain to known values which will later be "clocked" (propagated) through the logic to latches in Chain B 12 and Chain C 14. Unfortunately, in this example, there is a defect 16 in Chain A, causing the wrong values to be loaded in the lower (toward scan-out) part of the chain.

When the system clock propagates the improper load through the logic, it may cause incorrect values to show up in Chains B and C. The problem is that, although one knows Chain A loaded improperly, one doesn't know exactly how it was loaded. During load, all latches below the defect are loaded as 1s (later causing fails), but all latches have their normal values above the defect. However, during unload, the values for latches above the defect will appear to be 1s because they will be altered as they shift through the defect. This causes one to lose visibility to the actual load; and, therefore, the location of the defect.

This invention uses two hypothesis: (1) If you know the location of a defective latch, you can alter the load of all latches below the defect to match the characteristics of the defect, and then simulate clocking the pattern through the logic, the simulation will produce the same fails as the tester did. It follows that, if one doesn't know the defect's location, one could find the defective latch by exhaustively trying different loads and simulating until one finds one or more that matched the tester results.

(2) As those repeated simulations are done, the quality of the match will improve as the trial point approaches the actual defect. If this is true, then it is possible to design various algorithms that will quickly pinpoint the offending latch—for example, a type of binary search.

There is a range of fault models. The following taxonomy should help one in understanding them:

Stuck 0 or Stuck 1 Most scan diagnostic techniques apply to cases where the test results from a scan integrity test showed "stuck" results, either Stuck1 or Stuck0. These are usually caused by either a defective latch that is unable to pass along the proper value, or an A or B clock for a particular latch (or set of latches), which makes it impossible for a working latch to pass along proper values.

Scan Clocks Stuck On One could also imagine a case where scan clocks were stuck on. This defect causes the output to come out too quickly. With an A or B clock stuck on, bits "flush" right through a latch as if the latch weren't there. If a single latch is affected by the stuck-on clock, then 11001100 looks like 01100110. The string is shifted by as many bits as there are latches affected by the stuck-on clock.

Transition There is another class of fault that is significant: When the scan-integrity test intends 11001100 but shows a signature like 10001000. This can occur when the output of one latch has a fast rise time and a slow fall time and the clock skew is enough so the input of the next latch misses the rising transition (they are slow to fall). The opposite case is also possible (they are fast to fall). These kinds of faults occur much less frequently than stuck faults; but, when the product exhibits them, they are just as important to resolve. The slow to rise and fast to rise types may also exist or they may be simply inversions of slow to fall and fast to fall types. Table 1 shows the results of a scan-integrity test for each of these types.

Figure 3:
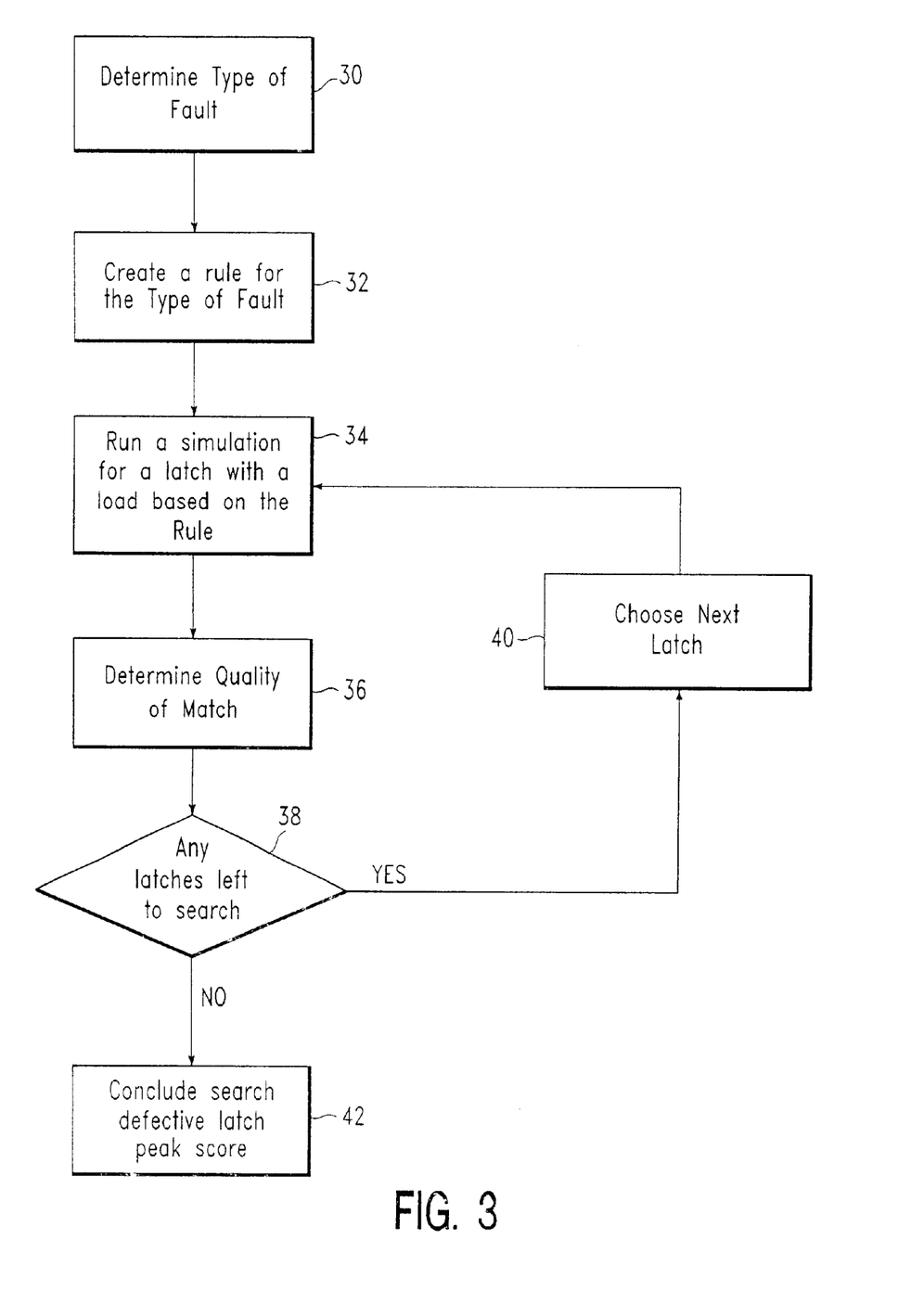
FIG. 3 is a block diagram of a general process for diagnosing a fault.

Referring to FIG. 3, the general process for diagnosing the fault by using these premises works this way. At step 30, using the definitions above, the type of fault is determined. At step 32, a rule is then created based on the signature that the fault creates. At step 34, you next run a "Good Machine" simulation of the normal test patterns for the expected defective latch, except you change your load based on the rule for the type of fault exhibited. At step 36, you then score the quality of the match between fails predicted by simulation and those observed by actual testing of device. The way the quality of the match is determined will be discussed below. You then at 38 either continue to simulate failures by choosing another latch to simulate at step 40 or conclude the search at 42 and find the latch with the peak score.

Examples of this applied to the types are shown in Table 1 below. These are examples of the rules that would be created in Step 32 and applied in Step 34.

TABLE 1

Scan-integrity test results

| Assume load of Unload | 001100110 011 Name | Comment |
|---|---|---|
| 000000000000 | Stuck0 | All values become 0 |
| 111111111111 | Stuck1 | All values become 1 |
| 000100010001 | FastToFall | Trailing 1 of each set becomes 0 |
| 001000100010 | SlowToRise | 1st 1 of each set becomes 0 |
| 101110111011 | FastToRise | Trailing 0 of each set becomes 1 |
| 011101110111 | SlowToFall | 1st 0 of each set becomes 1 |
| 011101110111 | ClkStuckOn1 | |
| xx0011001100 | ClkStuckOn2 | |
| xxx001100110 | ClkStuckOn3 | |
| xxxx00110011 | ClkStuckOn4 | |

For Stuck0 an example of the rule used when only one latch triggers fault is:

1. Load normally
2 Start at test point and move toward scan-out
3. Change each value to 0
4. Get next latch.
5. Repeat from 3 until reach scan-out.

For Stuck1 an example of the rule used when only one latch triggers fault is:
1. Load normally
2 Start at test point and move toward scan-out
3. Change each value to 1
4. Get next latch.
5. Repeat from 3 until reach scan-out.

For FastToFall an example of the rule used when only one latch triggers fault is:
1. Load normally.
2. Start at scan-out and move toward scan-in
3. If current latch value is 1 and next higher latch is 0, then change current latch value to 0.
4. Get next latch.
5. Repeat from 3. Until reach test point Note: It may take more latches to trigger fault. In that case, a slightly modified rule would be used.

For SlowToRise an example of the rule used when only one latch triggers fault is:
1. Load normally.
2. Start at test point and move toward scan-out.
3. If next lower latch value is 0 and current latch value is 1, then change current latch value to 0.
4. Get next latch.
5. Repeat from 3. Until reach scan-out Note: It may take more latches to trigger fault or more latches may be affected by the fault. In those cases, a slightly modified rules would be used.

For FastToRise an example of the rule used when only one latch triggers fault is:
1. Load normally.
2. Start at scan-out and move toward scan-in
3. If current latch value is 0 and next higher latch is 1, then change current latch value to 1.
4. Get next latch.
5. Repeat from 3. Until reach test point Note: It may take more latches to trigger fault. In that case, a slightly modified rule would be used.

For SlowToFall an example of the rule used when only one latch triggers fault is:
1. Load normally.
2. Start at test point and move toward scan-out.
3. If next lower latch value is 1 and current latch value is 0, then change current latch value to 1.
4. Get next latch.
5. Repeat from 3. Until reach scan-out Note: It may take more latches to trigger fault or more latches may be affected by the fault. In those cases, a slightly modified rules would be used.

The following formula provides a basis for scoring the quality of the test point:

$$\frac{\text{Matching Fails}}{\text{All Fails}} \times 100 \quad \text{or} \quad \frac{TFSF}{TFSF + TFSP + TPSF} \times 100$$

where matching fails are divided by all fails. Matching fails are the number of fails that are reported both by tester and the simulators (also referred to as TFSF for tester fail simulator fail). In addition to TFSF, all fails includes tester fails not reported by the simulator (also referred to as TFSP, "Test Fail/Simulator Pass") plus any "extra" fails that the simulator predicted but the tester did not record (also referred to as TPSF, or "Tester Pass/Simulator Fail"). The score is multiplied by 100 to normalize for consistency with other diagnostic tools. However, this is not necessary.

In order to utilize this scoring, you perform a binary search through the latches according to FIG. 3. To test a scan chain one can begin by running simulations for the first, middle and last latches and the scores recorded using the rule for the type. Then, the latch located at the midpoint between the two best scores is simulated. This process continues until there are no more midpoints. The latch with the best score is presumptively a defective latch. However, using this search approach there is an opportunity for a "false positive," a case where the search leads to a "false peak" caused by imperfections in the assumption that matches continually improve as the defect point is approached.

Figure 2:
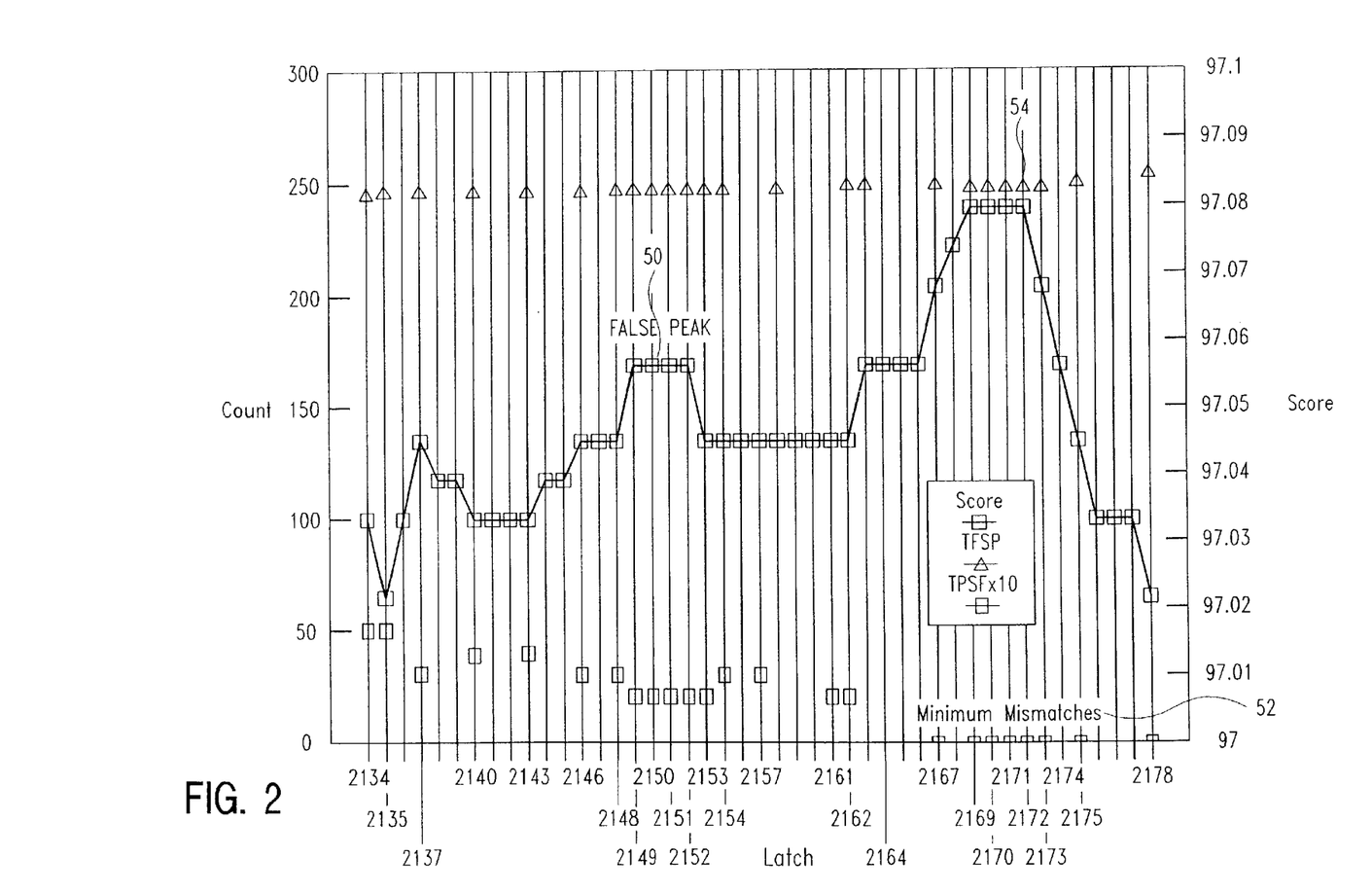
FIG. 2 is a graph illustrating actual scoring values for a subset of latches.

FIG. 2 shows actual values for a subset of latches. It should be noted that the latches are typically arbitrarily numbered in consecutive order starting from scan out. The extra "sub-peak" is shown as 50 and includes latch numbers 2149 through 2153. The "false peak" problem could be solved by ensuring that the maximum score coincides with the minimum number of mismatches (meaning TPSF+TFSP is at a minimum). These are shown as 52 on FIG. 2. FIG. 2 also shows how the variance in mismatches affect the score and how the mismatches can be used to get back on track. Counting mismatches leads one to the highest peak shown as 54 in FIG. 2. It should be noted that multiple latches can have the same peak score (latches 2169 through 2172).

A more extensive search technique could solve the problem of false peaks. However, it could lead to degrading the speed of the search of the diagnostic tool. The speed of the search is improved by combining several techniques: (1) A low bound is calculated. This is the highest place where the actual test results did NOT record the signature. This effectively shortens the range of latches to be examined and (2) gives an excellent candidate for the first test point which will likely give a high score. (3) Further, the mid point approach can be improved if, instead of dividing the range between latches with the best scores at the midpoint, a biased search is used. That is, the next test point is calculated to be much closer to the higher of the two best scores. An improved search algorithm which makes use of the above is illustrated in FIG. 4.

Figure 4:
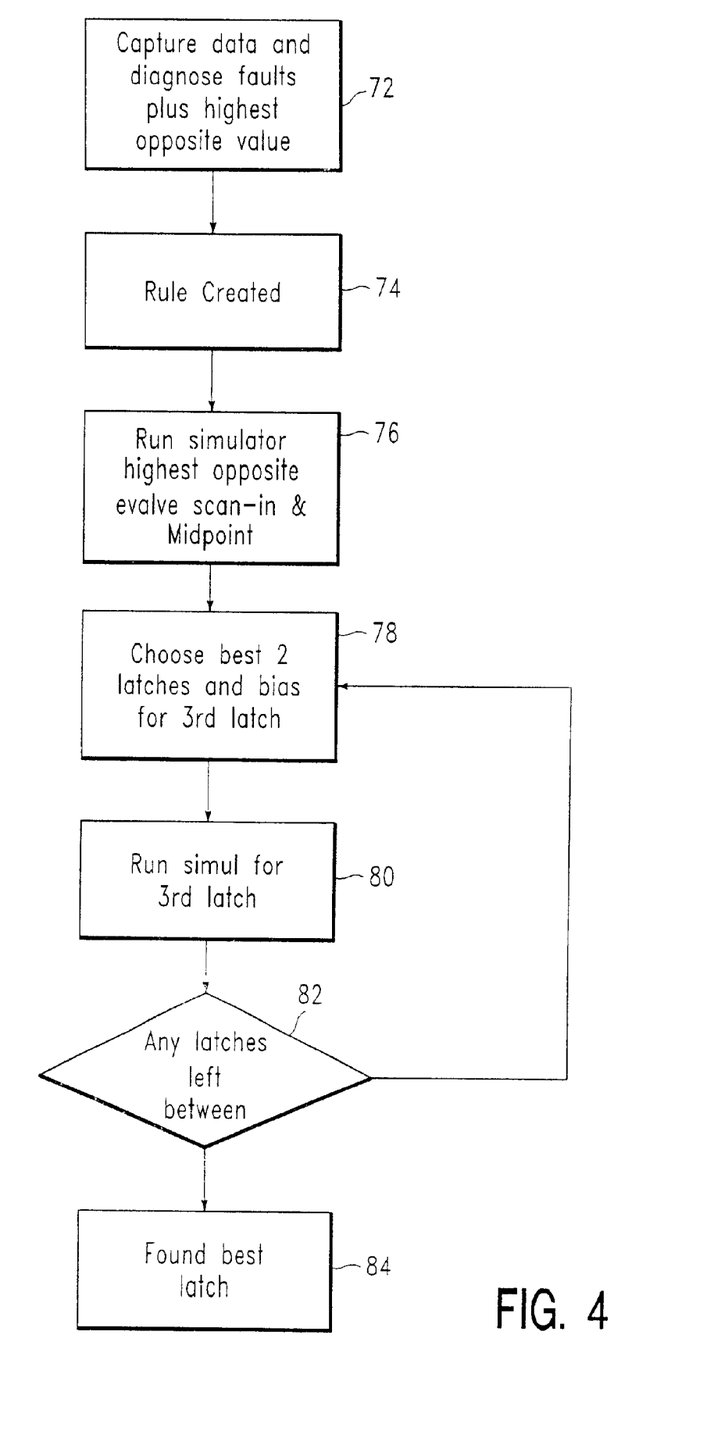
FIG. 4 is a block diagram of generalized search method for diagnosing a fault.

The diagnostic method illustrated by FIG. 4 using the low bound and a biased approach uses part of the fundamental approach described in FIG. 3. Like step 30 in FIG. 3, in step 72 the fails and the passing values from the tester are searched to determine the type of fault and, in addition the highest position that exhibits a working chain. Any non-germane fails are removed. Non-germane fails are fails that have no path back to the defective chain and therefore must belong to some other defect.

At step 74 (like step 32 in FIG. 3) a rule for the type of fault is created. At step 76 the simulations begin at the place where the low bound (highest opposite value) is found. The next test point is at the top (scan-in) of the chain or, if previous result was greater than a 95 score (or some other chosen value), at 15% (or some other biasing value) of the distance from previous latch to scan-in.

At step 78, and for each iteration), the method selects a latch between the two best scores. Then at 80 the method runs a simulation on this new latch. When scores are high, the latch selection is biased to a point close to the better score. Otherwise the search method chooses the midpoint. This is repeated until there are no more latches between best and second best (decision point 82).

As mentioned above, it is possible that the latches with the two best scores are either both higher or both lower in the chain than the actual defect. Therefore, taking a biased midpoint does not bring us any closer to the defect. The solution is to select a latch on the "other side" of the best latch (step 78) by performing the following whenever the most recently simulated latch is the second best score: (The next latch is calculated as usual using the biased technique.)

a. If the second best-scoring latch is closer to scan-out than the best latch, choose the latch that is the same number of latches from the best latch but closer to scan-in.

b. If the second best-scoring latch is closer to scan-in, the next latch is chosen toward scan-out.

This latch is characterized as being on the other side and is denoted as "other." Once the best score is determined at step 84 an additional pass is made through the algorithm using minimized mismatches and maximized match counts to ensure the correct peak is selected. This avoids the "false peak" problem.

Figure 5:
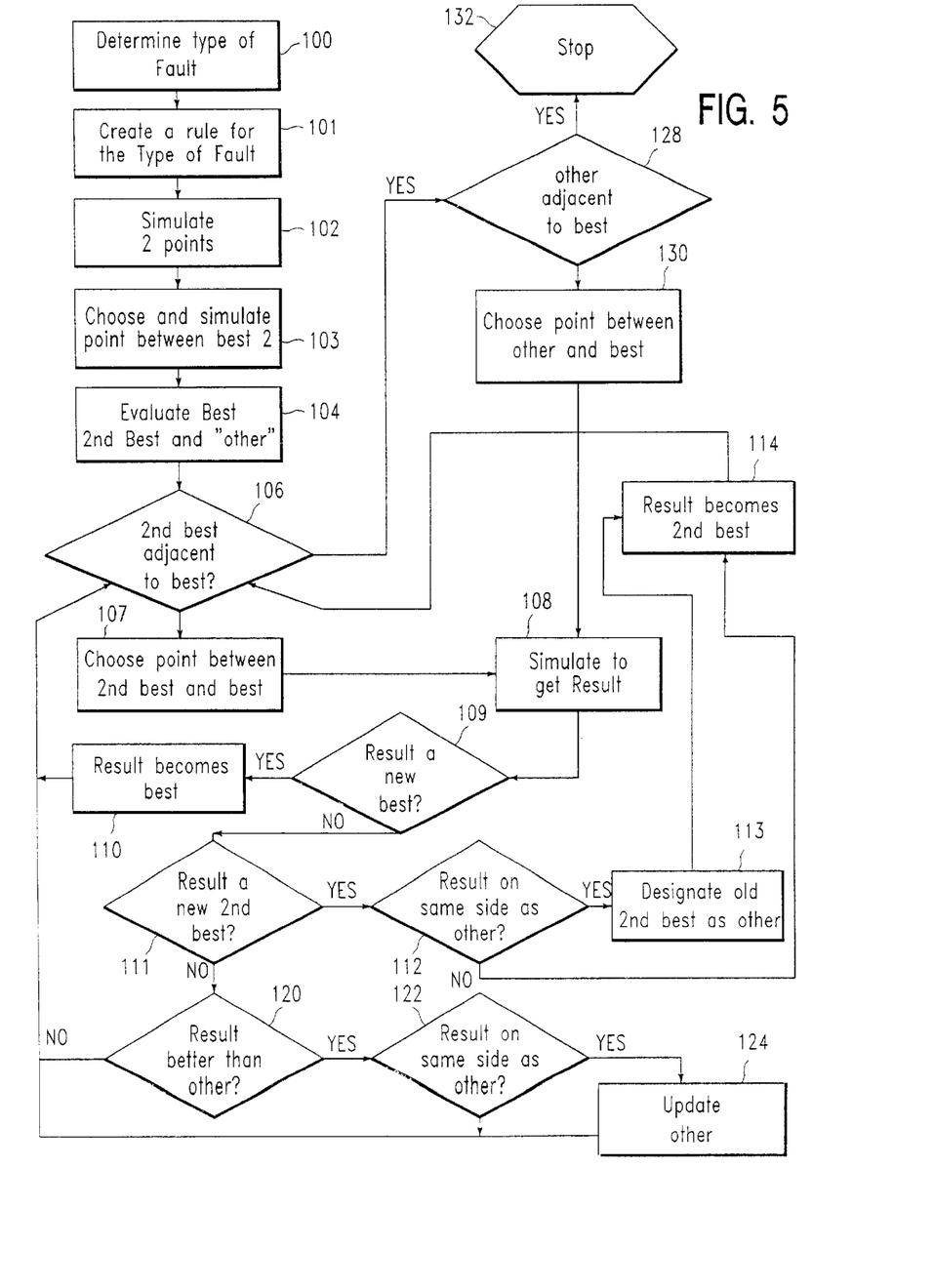
FIG. 5 is a block diagram a search technique that overcomes the "false peak" problem.

A variation of this "other side" approach is illustrated in the flow chart of FIG. 5. This approach involves a more extensive search technique. Once the type of fail, rule, and low bound are determined, step 100 finds the score for the low bound and latch at the scan in. The entry points steps 100, 101, 102, and 103 are the same as in FIG. 4. Latches are simulated at 103 and evaluated at 104. If the second best scored latch is not next to the best scored latch (i.e. its latch numbers are not adjacent to one another) at 106, the process steps to 107 where another latch point is chosen between best and second best (using biasing if either score is high enough). At step 108 that new latch is simulated. At decision block 109 it is determined whether or not its score makes it the new best latch found so far. If it is a new best scoring latch the process iterates back to 106 through 110 where the loop just discussed is run again. If it is not a new best, at decision block 111 it is determined whether or not its score makes it the new second best latch found so far. If the result is a new second best another inquiry at 112 is made as to whether the new best latch is on the same side as "other" (i.e., are "other" and the "second best" latch numbers both higher or both lower than the best latch number). If they are on the same side, the old second best latch number is designated "other" at 113, and the result is designated second best at step 114. If they are on different sides, the result is directly updated as second best at step 114.

Figure 6A:
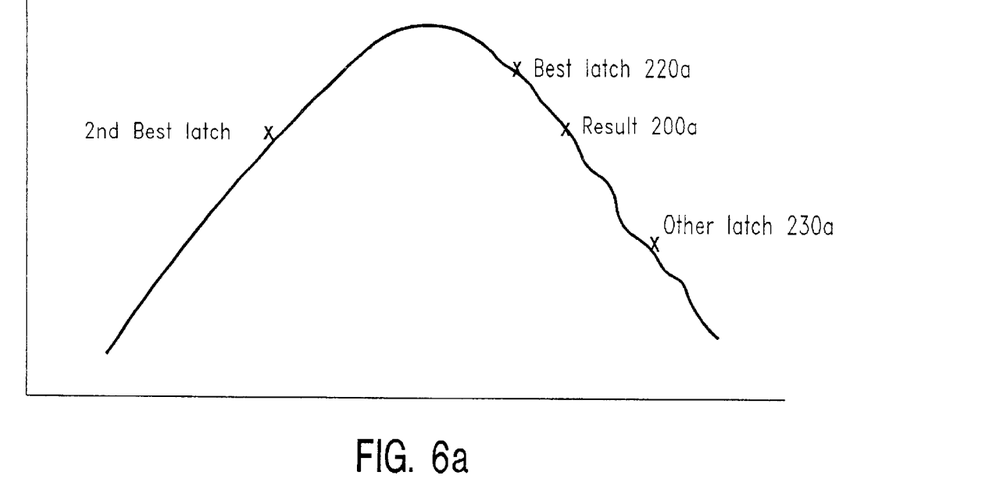
FIGS. 6A and 6B are graphical depict ions of best, second best and other.
Figure 6B:
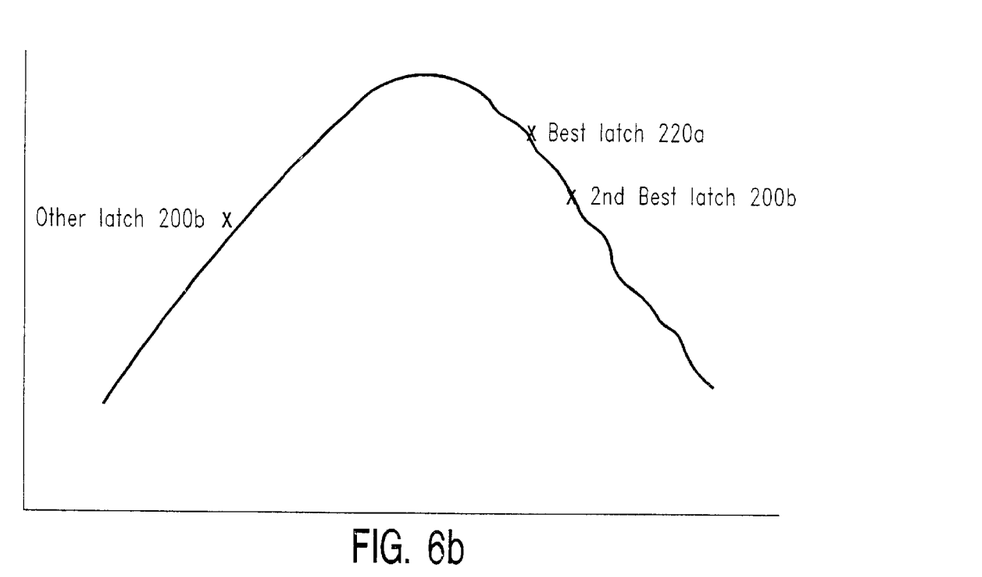

This last set of process steps is graphically depicted in FIGS. 6A and 6B. If the result (200a) of the latest simulation is better than the 2nd best (210a) (but not better than best (220a)), then it becomes the new 2nd best (200b). However, that would leave the latch numbers of other and 2nd best both greater than best. Therefore the old 2nd best (210b) is now tracked as other. Only 3 points are tracked so 230a disappears. Other is defined to be the best latch on the "other" side of best from 2nd best. That is, if the latch number for 2nd best is higher than the latch number for best, then other is the best scoring point whose latch number is less than best and vice versa.

Returning to Step 111 in FIG. 5, if the new latch result is not a new second best latch a comparison is run at step 120 to determine whether it is better than "other." If the result is better than other at 120, the next step is decision block 122. If it is not the process returns to 106, and another iteration is run. At 122 it is determined whether or not the result is on the same side as "other." If it is the "other" is updated with the result at 124 with the new latch number and score. After the update or not on the same side the process routes back to 106. This process continues to iterate until a simulation is run where the best and second best latches are adjacent to one another (decision point 106) and ultimately until the "other" latch is next to best latch at 128. If they are all adjacent the defective latch is found and the program is stopped at 132. If other is not next to best latch another iteration occurs at 130 with a point chosen between other and best (with biasing as appropriate). One does not have to wait until second best is adjacent to best. That is you may spend some additional time working in on closing in on one side that ultimately is not the best. So one may alternate between second best and best and other and best. For example, anytime the result is a new second best, you may want to run and iteration between other and best. With biasing this approach may actually lead to closing on the defective latch sooner.

Figure 7:
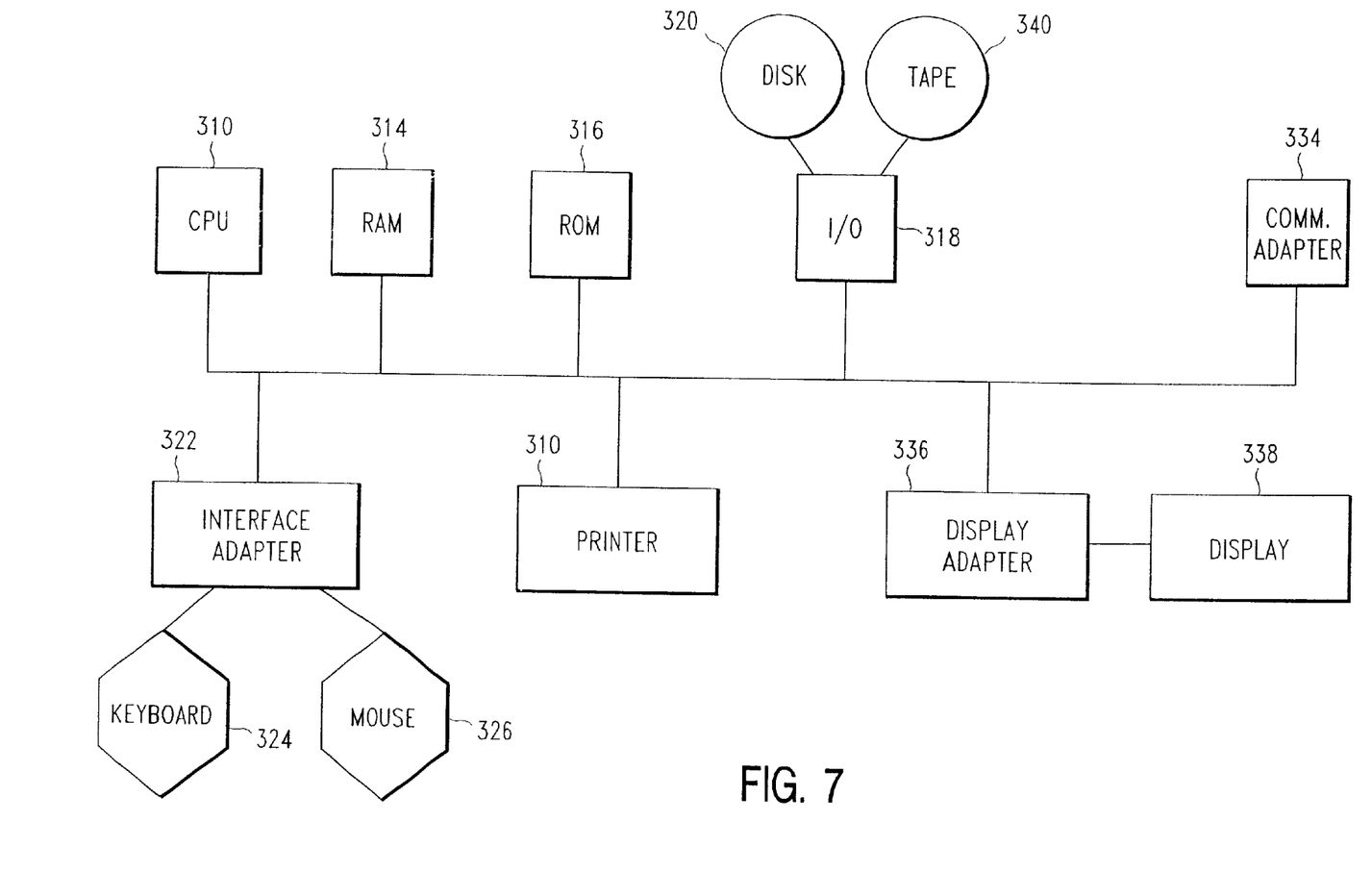
FIG. 7 is a block diagram of a representative computer system used in practicing this invention.

A representative hardware environment for practicing the present invention is depicted in FIG. 7, which illustrates the typical hardware configuration of a computer system capable of performing the diagnostic approach in accordance with the subject invention having at least one processor or central processing unit (CPU) 310. CPU(s) 310 are interconnected via system bus 312 to a random access memory (RAM) 314, read-only memory (ROM) 316, an input/output (I/O) adapter 318 for connecting peripheral devices such as disk units 320 and tape drives 340 to bus 312, user interface adapter 322 for connecting keyboard 324, mouse 326, and/or other user interface devices such as a microphone or touch screen device (not shown) to bus 312, communication adapter 334 for connecting the information handling system to a data processing network, and display adapter 336 for connecting bus 312 to display device 338. The rules and scan data and rules shown on FIGS. 3, 4 and 5, the simulator, and the code for performing the method according to the flowcharts shown on FIGS. 3, 4 and 5 are loaded on the appropriate disk or tape units on computer media contained therein or fed either through I/O adapters or the network for processing. A computer program with an appropriate application interface could be created by one of skill in the art and stored on the system to simplify the practicing of this invention.

It should be realized that the teaching of this invention is applicable to various types of scan-chain networks including but not limited to the LSSD types mentioned above. Thus, while this invention has been particularly shown and described with respect to preferred embodiments thereof, it will be understood by those skilled in the art that changes in form and details may be made therein without departing from the scope and spirit of the invention.

What is claimed is:

1. A computerized method for diagnosing transient and stuck faults in scan chains comprising the steps of:

examining repeating patterns in the scan test to determine the type of fault;

creating a signature load for each stuck and transient fault based on the repeating pattern for each type of fault;

running a simulation using the signature at a selected assumed fault position;

comparing the simulated result with the actual scan test result to see if the fault position was determined; and     iterating through other assumed fault positions until the simulated result matches the actual scan test results.

2. The method of claim 1 also comprising the step of determining the quality of the match between the simulated result and the actual scan test result.

3. The method of claim 2 also comprising the step of determining the defective latch by finding the highest quality score.

4. The method of claim 2 also comprising the steps of simulating using a signature of a plurality of latches;
selecting the best two latches based on the quality of their matches; and
choosing a latch between the best two latches on which to evaluate by running a simulation using a signature.

5. The method of claim 1 where the selected assumed fault position is highest latch position where the actual test results did NOT record the signature.

6. The method of claim 4 where one of the plurality of latches is the highest latch position where the actual test results did NOT record the signature.

7. The method of claim 4 where the latch chosen is biased towards the latch with the highest quality score.

8. The method of claim 7 where the latch chosen is biased towards the latch with the highest quality score only if the score exceeds a predetermined amount.

9. The method of claim 4 also comprising the steps of:
running simulations of latches on the other side of the latch with a best quality score from the latch with a second quality score and
determining which latch's quality scores are best, second best and other.

10. The method of claim 9 also comprising the step of determining whether the result is the same side as other when it is second best.

11. The method of claim 10 also comprising the step of determining whether the result is on the same side as other when it is greater than other but not second best or best.

12. A computer system for diagnosing transient and stuck faults in scan latches which comprises
examining repeating patterns in the scan test to determine the type of fault;
a user interface which inputs into the computer system a signature load for each stuck and transient fault based on the repeating pattern for each type of fault into a scan chain;
a means for running a latch simulation program loaded into memory using the signature at a selected assumed fault position;
a means for comparing the simulated results with the actual scan test results read into memory which to see if the fault position was determined; and
means for iterating through other assumed fault positions until the simulated result matches the actual scan test results.

13. The computer system of claim 12 also comprising a means for determining the quality of the match between the simulated result and the actual scan test result.

14. The computer system of claim 12 which also comprises
a means for simulating using a signature a plurality of latches;
means for selecting the best two latches based on the quality of their matches; and
means for choosing a latch between the best two latches on which to evaluate by running a simulation using a signature.

15. The computer system of claim 14 which also comprises:
a means for running simulations of latches on the other side of the latch with a best quality score from the latch with a second quality score and
a means for determining which latch's quality scores are best, second best and other.

16. The computer system of claim 15 which also comprises:
a means for determining whether the result is the same side as other when it is second best, and
a means for determining whether the result is on the same side as other when it is greater than other but not second best or best.

17. A program storage device readable by the machine, tangibly embodying a program of instructions executable by the machine to perform the method steps for diagnosing faults in a scan chain, said method steps comprising:
examining repeating patterns in the scan test to determine the type of fault;
creating a signature load for each stuck and transient fault based on the repeating pattern for each type of fault;
running a simulation using the signature at a selected assumed fault position;
comparing the simulated result with the actual scan test result to see if the fault position was determined; and
iterating through other assumed fault positions until the simulated result matches the actual scan test results.

18. A program storage device readable by the machine, tangibly embodying a program of instructions executable by the machine to perform the method steps for diagnosing faults in a scan chain of claim 17, said method steps also comprising the step of determining the quality of the match between the simulated result and the actual scan test result.

19. A program storage device readable by the machine, tangibly embodying a program of instructions executable by the machine to perform the method steps for diagnosing faults in a scan chain of claim 18, said method steps also comprising the step of deterring the defective latch by finding the highest quality score.

20. A program storage device readable by the machine, tangibly embodying a program of instructions executable by the machine to perform the method steps for diagnosing faults in a scan chain of claim 18, said method steps also comprising the steps of:
simulating using a signature a plurality of latches;
selecting the best two latches based on the quality of their matches; and
choosing a latch between the best two latches on which to evaluate by running a simulation using a signature.

21. A program storage device readable by the machine, tangibly embodying a program of instructions executable by the machine to perform the method steps for diagnosing faults in a scan chain of claim 17, where the selected fault position is highest latch position where the actual test results did NOT record the signature.

22. A program storage device readable by the machine, tangibly embodying a program of instructions executable by the machine to perform the method steps for diagnosing faults in a scan chain of claim 20, where one of the plurality of latches is the highest latch position where the actual test results did NOT record the signature.

23. A program storage device readable by the machine, tangibly embodying a program of instructions executable by the machine to perform the method steps for diagnosing faults in a scan chain of claim 20, where the latch chosen is biased towards the latch with the highest quality score.

24. A program storage device readable by the machine, tangibly embodying a program of instructions executable by the machine to perform the method steps for diagnosing faults in a scan chain of claim 23, where the latch chosen is biased towards the latch with the highest quality score only if the score exceeds a predetermined amount.

25. A program storage device readable by the machine, tangibly embodying a program of instructions executable by the machine to perform the method steps for diagnosing faults in a scan chain of claim 20, said method steps comprising the steps of:

running simulations of latches on the other side of the latch with a best quality score from the latch with a second quality score and p1 determining which latch's quality scores are best, second best and other.

26. A program storage device readable by the machine, tangibly embodying a program of instructions executable by the machine to perform the method steps for diagnosing faults in a scan chain of claim 25, said method steps also comprising the steps of:

determining whether the result is the same side as other when it is second best and     determining whether the result is on the same side as other when it is greater than other but not second best or best.

\* \* \* \* \*